United States Patent
Buley et al.

(10) Patent No.: US 6,711,810 B2
(45) Date of Patent: Mar. 30, 2004

(54) METHOD OF ASSEMBLING A LAND GRID ARRAY MODULE

(75) Inventors: Todd H. Buley, Stone Ridge, NY (US); Roger Lam, Fishkill, NY (US); Daniel O'Connor, Millbrook, NY (US); Charles Hampton Perry, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 175 days.

(21) Appl. No.: 09/956,369

(22) Filed: Sep. 19, 2001

(65) Prior Publication Data

US 2003/0051338 A1 Mar. 20, 2003

(51) Int. Cl.⁷ .................................................. H05K 3/36
(52) U.S. Cl. ........................... 29/830; 29/281.1; 29/739; 29/760; 29/764; 29/832; 29/834; 257/776; 269/903; 361/807
(58) Field of Search ............................ 29/832, 834, 837, 29/830, 840, 843, 854, 759, 760, 271, 281.5, 281.1, 739, 743, 763; 257/776, 777, 797; 361/807–809, 820; 269/47, 903, 908

(56) References Cited

U.S. PATENT DOCUMENTS

| | | | | |
|---|---|---|---|---|
| 4,646,435 A | * | 3/1987 | Grassauer | 29/840 |
| 5,207,465 A | * | 5/1993 | Rich | 29/743 |
| 5,215,472 A | * | 6/1993 | DelPrete et al. | 439/71 |
| 5,302,853 A | | 4/1994 | Volz et al. | 257/707 |
| 5,467,526 A | * | 11/1995 | Kunkel et al. | 29/747 |
| 5,526,974 A | * | 6/1996 | Gordon et al. | 228/103 |
| 5,953,816 A | | 9/1999 | Pai et al. | 29/879 |
| 5,983,477 A | * | 11/1999 | Jacks et al. | 29/407.1 |
| 5,984,693 A | | 11/1999 | McHugh et al. | 439/66 |
| 5,991,161 A | | 11/1999 | Samaras et al. | 361/760 |
| 6,191,480 B1 | | 2/2001 | Kastberg et al. | 257/727 |
| 6,386,432 B1 | * | 5/2002 | Jin et al. | 29/743 |

* cited by examiner

Primary Examiner—A. Dexter Tugbang
Assistant Examiner—Donghai D Nguyen
(74) Attorney, Agent, or Firm—Ira D. Blecker

(57) ABSTRACT

A method in which an alignment tool consisting of a nest and guide tool is used to align an LGA module in the nest and then the LGA module is removed from the nest and aligned with a circuit card by the use of the guide tool.

6 Claims, 2 Drawing Sheets

METHOD OF ASSEMBLING A LAND GRID ARRAY MODULE

BACKGROUND OF THE INVENTION

The present invention generally relates to a land grid array and, more particularly, to a method of assembling a land grid array module and an alignment tool for use in the assembling of the land grid array module.

Traditionally, electronic components have been connected to circuit cards (or printed wiring boards) by solder or by pins on the electronic components inserted into plated through holes in the circuit cards. The attachment of an electronic component to a circuit card is generally referred to as "second level packaging".

With the increasing complexity of circuit cards and their components, reworking of electronic components (i.e., removing defective electronic components from the circuit card and replacing them with nondefective electronic components) has become increasingly necessary, such that reworkability is now an extremely important design criterion.

In response to the demands of component rework, the land grid array (hereafter LGA) concept has been developed. Generally speaking, in LGA technology, contacts on the electronic component are mechanically held against mating pads on the circuit card. To facilitate the electrical connection between the electronic component and circuit card, an LGA socket or interposer may be placed between the electronic component and circuit card.

A typical land grid array (hereafter LGA) design is illustrated in Kastberg et al. U.S. Pat. No. 6,191,480, the disclosure of which is incorporated by reference herein. In Kastberg et al., a semiconductor device 50 is joined to a substrate 20 having contact pads which are to make contact with contact pads on a circuit card (not shown). Contact between the contact pads on the substrate 20 and the contact pads on the circuit card are made through LGA socket 15 (also called an LGA interposer) which is placed on the circuit card. Substrate 20 is mechanically held in the LGA socket 15 by pressure plate 10.

Other art relating to LGA technology includes:

Samaras et al. U.S. Pat. No. 5,991,161, the disclosure of which is incorporated by reference herein, discloses an LGA interposer for multi-chip applications.

McHugh et al. U.S. Pat. No. 5,984,693, the disclosure of which is incorporated by reference herein, discloses a contact embodiment for an LGA socket.

Pai et al. U.S. Pat. No. 5,953,816, the disclosure of which is incorporated by reference herein, discloses a process for making an interposer for an LGA.

Volz et al. U.S. Pat. No. 5,302,853, the disclosure of which is incorporated by reference herein, discloses a frame and latching mechanism for mechanically attaching an LGA package to a circuit card.

To place the LGA socket on the circuit card, alignment pins on the underside of the LGA socket must be aligned into mating holes in the circuit board. During the alignment operation, there is the tendency to press down on the LGA socket and wipe the bottom side of the LGA socket against the circuit board which may result in a smearing of the contacts in the LGA socket. Smearing can result in defective contact points which can lead to bridging between the contact pads or to opens. Either of these circumstances is undesirable.

To address this alignment problem, there is a need for an alignment method to align the LGA socket and the circuit card.

Accordingly, it is a purpose of the present invention to have a method to align an LGA socket (with an electronic component) with a circuit card.

It is another purpose of the present invention to have such a method to align an LGA socket with a circuit card that is easy to accomplish and that does not damage the LGA socket or any of the other mating electronic components.

These and other purposes of the invention will become more apparent after referring to the following description considered in conjunction with the accompanying drawings.

BRIEF SUMMARY OF THE INVENTION

The purposes of the invention have been achieved by providing, according to a first aspect of the present invention, a method of assembling a land grid array module comprising a land grid array card, land grid array socket and substrate, the method comprising the steps of:

(a) obtaining an alignment tool comprising a nest and guide tool;

(b) inserting the land grid array socket and substrate into the nest;

(c) inserting the guide tool into the nest;

(d) picking up the guide tool, substrate and land grid array interposer from the nest;

(e) placing the guide tool, substrate and land grid array socket onto the land grid array card; and (f) removing the guide tool.

According to a second aspect of the invention, there is provided an alignment tool for assembling a land grid array comprising:

a nest comprising a body having a plurality of apertures and a plurality of locating portions for accurately locating a land grid array socket; and a guide tool comprising a planar body having a plurality of guide pins and a plurality of cutout portions;

wherein, in operation, a land grid array socket is placed in the nest and accurately located therein by the nest locating portions, a substrate is placed on the land grid array socket, and the guide tool is releasably joined to the nest by inserting the guide pins into the apertures of the nest, the cutouts of the guide tool allowing one to simultaneously grip the land grid array socket, substrate and guide tool planar body.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
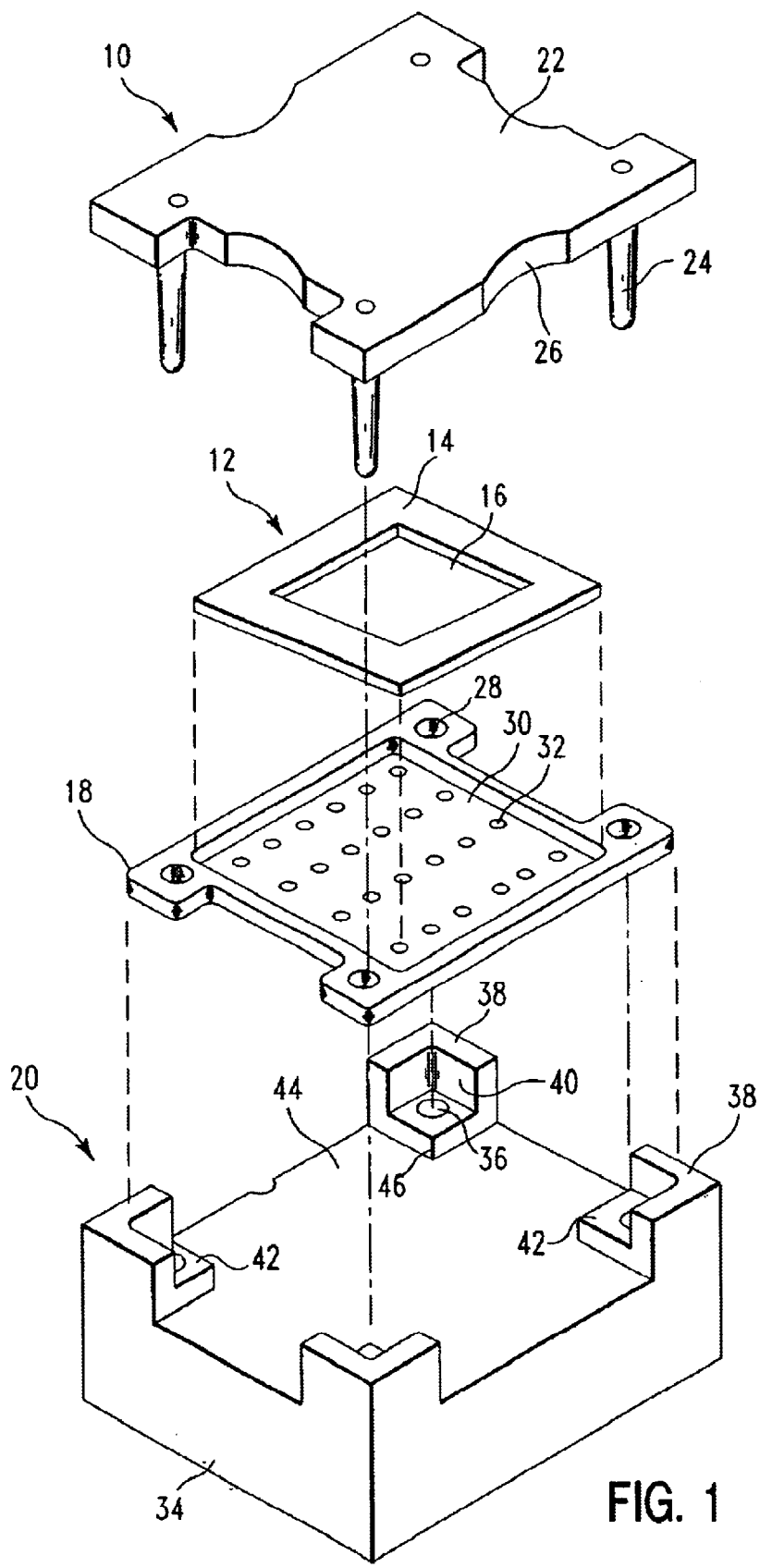
FIG. 1 is an exploded view of an LGA module and the alignment tool for use therewith according to the present invention.

Referring to the Figures in more detail, and particularly referring to FIG. 1, there is shown an alignment tool comprised of a nest 20 and guide tool 10. Referring first to guide tool 10, the guide tool 10 has a generally planar body 22, a plurality of guide pins 24 and a plurality of cutout portions 26. While there are four guide pins 24 and four cutout portions 26 shown for purposes of illustration, it can be appreciated that there can be more or less than four guide pins 24 and four cutout portions 26 depending on the particular application.

Nest 20 comprises a body 34 and four locating portions 38 for receiving an LGA socket or interposer 18 (hereafter just LGA socket). Each of the locating portions 38 has vertical locating surfaces 40, horizontal locating surfaces 42 and guide pin holes 36. The nest 20 also has a main horizontal surface 44. In a preferred embodiment of the present invention, horizontal locating surfaces 42 are vertically offset from main horizontal surface 44 by a distance indicated by 46.

The LGA socket 18 has an area 30 for receiving an electronic component 12. Included within area 30 are contacts 32 for making contact between contact pads (not shown) of the electronic component and contact pads of a circuit card (not shown). Contacts 32 may be flexible metal contacts or so-called "fuzz buttons" as are known to those skilled in the art. LGA socket 18 further comprises a plurality of guide pin holes 28. As will become apparent hereafter, the number of guide pins 24, the number of LGA socket guide pin holes 28 and the number of nest guide pin holes 36 preferably should be the same.

Electronic component 12 as shown in FIG. 1 comprises an electronic substrate 14 (ceramic or organic) on which is mounted a semiconductor device 16. LGA socket 18 and electronic component 12 together make up an LGA module. It should be apparent that electronic components 12 and LGA sockets 18 other than what are illustrated herein can be used in the practice of the present invention.

In operation, LGA socket 18 is placed in the nest 20 and accurately located therein by locating portions 38. Then, electronic component 12 is placed on area 30 of LGA socket 18. It should be noted that electronic component 12 could be loaded on LGA socket 18 prior to placing the LGA socket 18 in nest 20. Lastly, guide pins 24 of guide tool 10 are inserted into LGA socket guide pin holes 28 and then into nest guide pin holes 36.

Figure 2:
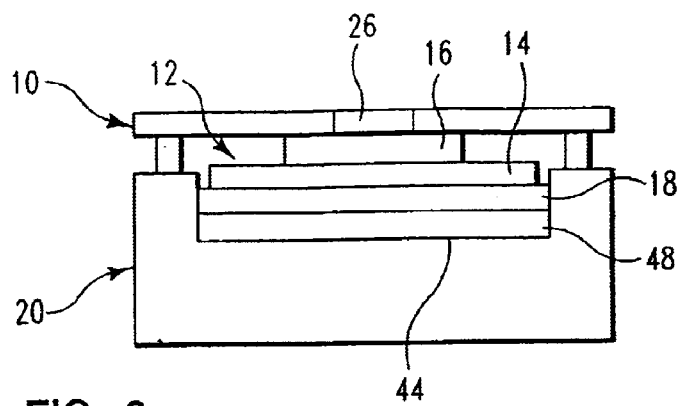
FIG. 2 is a side view of the LGA module assembled in the alignment tool according to the present invention.

Referring now to FIG. 2, there is shown the LGA socket 18, substrate 14 and semiconductor device 16 captured within the alignment tool according to the present invention comprised of nest 20 and guide tool 10. In a preferred embodiment of the present invention, there is a gap 48 between nest main horizontal surface 44 and LGA socket 18 due to the vertically offset horizontal locating surfaces 42 as discussed above.

Figure 3:
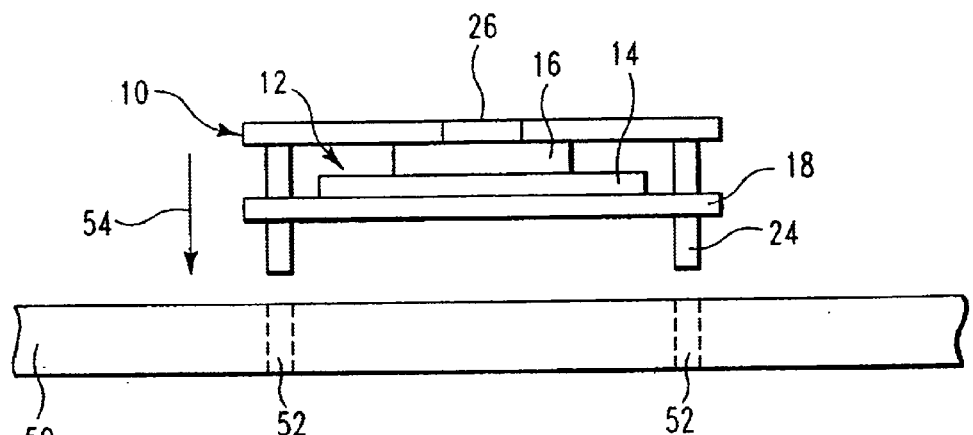
FIG. 3 illustrates the step of aligning the LGA module to a circuit card utilizing the guide tool according to the present invention.

Referring now to FIG. 3, guide tool 10, LGA socket 18 and electronic component 12 have been manually removed from the nest 20. In this regard, a technician would place a finger on each side of the guide tool and exert horizontal pressure on the LGA socket 18 and electronic component 12 while also gripping on to the guide tool 10. The cutouts 26 in the guide tool 10 assist the technician in being able to use his fingers to keep the LGA socket 18 and electronic component 12 in registry with the guide pins 24 of the guide tool 10. Thereafter, the guide tool 10, with LGA socket 18 and electronic component 12 constrained therein by finger pressure from the technician, is moved downwardly, indicated by arrow 54, to align guide pins 24 of the guide tool 10 with apertures 52 of circuit card 50 and to make contact with circuit card 50.

Figure 4:
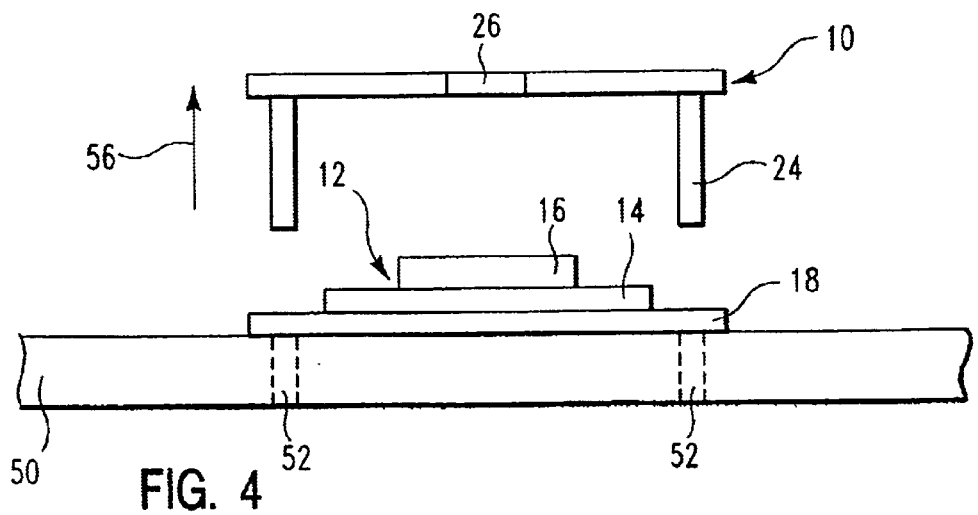
FIG. 4 illustrates the step of removing the guide tool according to the present invention after the LGA module has been placed on the circuit card.

Once the LGA socket 18 and electronic component 12 have been properly aligned with and on circuit card 50, the guide tool 10 may be removed by the technician as indicated by arrow 56 in FIG. 4. LGA socket 18 and electronic component 12 may then be mechanically constrained on the circuit card 50 by suitable apparatus as is well known to those skilled in the art.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method of assembling a land grid array module comprising a land grid array card, land grid array socket and substrate, the method comnrising the steps of:

(a) obtaining an alignment tool comprising a nest and guide tool, wherein the nest comprises a body having a plurality of apertures and plurality of locating portions for accurately locating the land grid array socket with respect to the nest and the guide tool comprises a planar body having a plurality of guide pins for inserting into the plurality of apertures and a plurality of cutout portions;

(b) inserting the land grid array socket and substrate into the nest;

(c) inserting the guide tool into the nest;

(d) picking up the guide tool, substrate and land grid array interposer socket from the nest;

(e) placing the guide tool, substrate and land grid array socket onto the land grid array card, wherein the land grid array card has a plurality of alignment holes and the step of placing includes aligning the guide pins of the guide tool with the alignment holes of the land grid array card; and (f) removing the guide tool.

2. A method of assembling a land grid array module comprising a land grid array card, land grid array socket and substrate, the method comprising the steps of:

(a) obtaining an alignment tool comprising a nest and guide tool;

(b) inserting the land grid array socket and substrate into the nest;

(c) inserting the guide tool into the nest;

(d) picking up the guide tool, substrate and land grid array socket from the nest;

(e) placing the guide tool, substrate and land grid array socket onto the land grid array card; and (f) removing the guide tool.

3. The method of claim 2 wherein the nest comprises a body having a plurality of apertures and a plurality of locating portions in contact with the land array socket for accurately locating the land grid array socket with respect to the nest; and the guide tool comprises a planar body having a plurality of guide pins for inserting into the plurality of apertures and a plurality of cutout portions.

4. The method of claim 2 wherein the body of the nest comprises a planar surface and the plurality of locating portions in contact with the land grid array socket are raised with respect to the planar surface.

5. The method of claim 4 wherein the guide tool planar body and the nest body are rectangular.

6. The method of claim 2 wherein the land grid array card, land grid array socket and substrate are separate items.

* * * * *